United States Patent
Ramaraju et al.

(10) Patent No.: US 9,224,439 B2
(45) Date of Patent: Dec. 29, 2015

(54) MEMORY WITH WORD LINE ACCESS CONTROL

(75) Inventors: Ravindraraj Ramaraju, Round Rock, TX (US); George P. Hoekstra, Austin, TX (US); Andrew C. Russell, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 617 days.

(21) Appl. No.: 13/537,209

(22) Filed: Jun. 29, 2012

(65) Prior Publication Data

US 2014/0003172 A1  Jan. 2, 2014

(51) Int. Cl.
*G11C 7/00* (2006.01)
*G11C 7/10* (2006.01)
*G11C 8/10* (2006.01)
*G11C 11/418* (2006.01)

(52) U.S. Cl.
CPC ............... *G11C 7/1075* (2013.01); *G11C 8/10* (2013.01); *G11C 11/418* (2013.01)

(58) Field of Classification Search
CPC ....... G11C 15/00; G11C 15/046; G11C 29/10
See application file for complete search history.

(56) References Cited

U.S. PATENT DOCUMENTS

| | | | |
|---|---|---|---|
| 5,231,604 A | 7/1993 | Watanabe | |
| 6,577,524 B2 | 6/2003 | Brooks et al. | |
| 6,597,629 B1 * | 7/2003 | Raszka et al. ............... | 365/233.1 |
| 7,415,640 B1 | 8/2008 | Zorian et al. | |
| 7,698,536 B2 | 4/2010 | Dieffenderfer et al. | |
| 8,014,215 B2 | 9/2011 | Lee et al. | |
| 8,976,604 B2 | 3/2015 | Hung | |
| 2011/0090745 A1 * | 4/2011 | La Rosa ................... | 365/189.09 |
| 2011/0157987 A1 | 6/2011 | Cernea | |

OTHER PUBLICATIONS

U.S. Appl. No. 14/258,730, Hoekstra, G. et al., "Memory With Redundancy", filed Apr. 22, 2014, Office Action—Rejection, mailed Jul. 23, 2015.

* cited by examiner

*Primary Examiner* — Son Dinh
*Assistant Examiner* — Uyen B Tran (57) ABSTRACT

A memory having a memory array having a plurality of word lines, a plurality of bit cells coupled to the word lines, and a plurality of control memory cells coupled to the word lines. Each word line of the plurality of word lines has a control memory cell coupled thereto and each control memory cell has an output. The memory also has a plurality of logic circuits coupled to the plurality of word lines. The output of each control memory cell is coupled to a corresponding one of the plurality of logic circuits. The plurality of logic circuits prevents access to the word line selected by a row address if the output of the control memory cell coupled to the selected word line is in a first logic state.

20 Claims, 5 Drawing Sheets

MEMORY WITH WORD LINE ACCESS CONTROL

BACKGROUND

1. Field

This disclosure relates generally to memories, and more specifically, to word line access control within a memory.

2. Related Art

Reducing power consumption is an increasingly important aspect in memories. This is especially true in battery powered mobile devices. In memories, read accesses typically contribute to significant power consumption of the memory. Therefore, by reducing unnecessary read accesses, power consumption can be reduced.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As described above, it is desirable to reduce unnecessary read accesses to a memory to reduce power consumption of the memory. For example, unnecessary read accesses may include accesses to memory entries which are invalid or locked, such as in a cache memory. Other unnecessary read accesses may be certain accesses performed during soft error rate (SER) detection scrubbing. Therefore, in one embodiment of the present invention, a control memory cell in each word line of a memory array may allow each corresponding word line to be independently blocked from access. In this manner, when a blocked row is selected for a memory access, the word line of the blocked row is not driven in response to the memory access, thus allowing for reduced power consumption as compared to those memories in which a row of the memory is read unnecessarily and the read data is subsequently discarded or ignored. Furthermore, in one embodiment, the control memory cell of a word line can be overridden such that an access to the corresponding word line is allowed regardless of the state of the control memory cell.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by the word "bar" or a "b" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
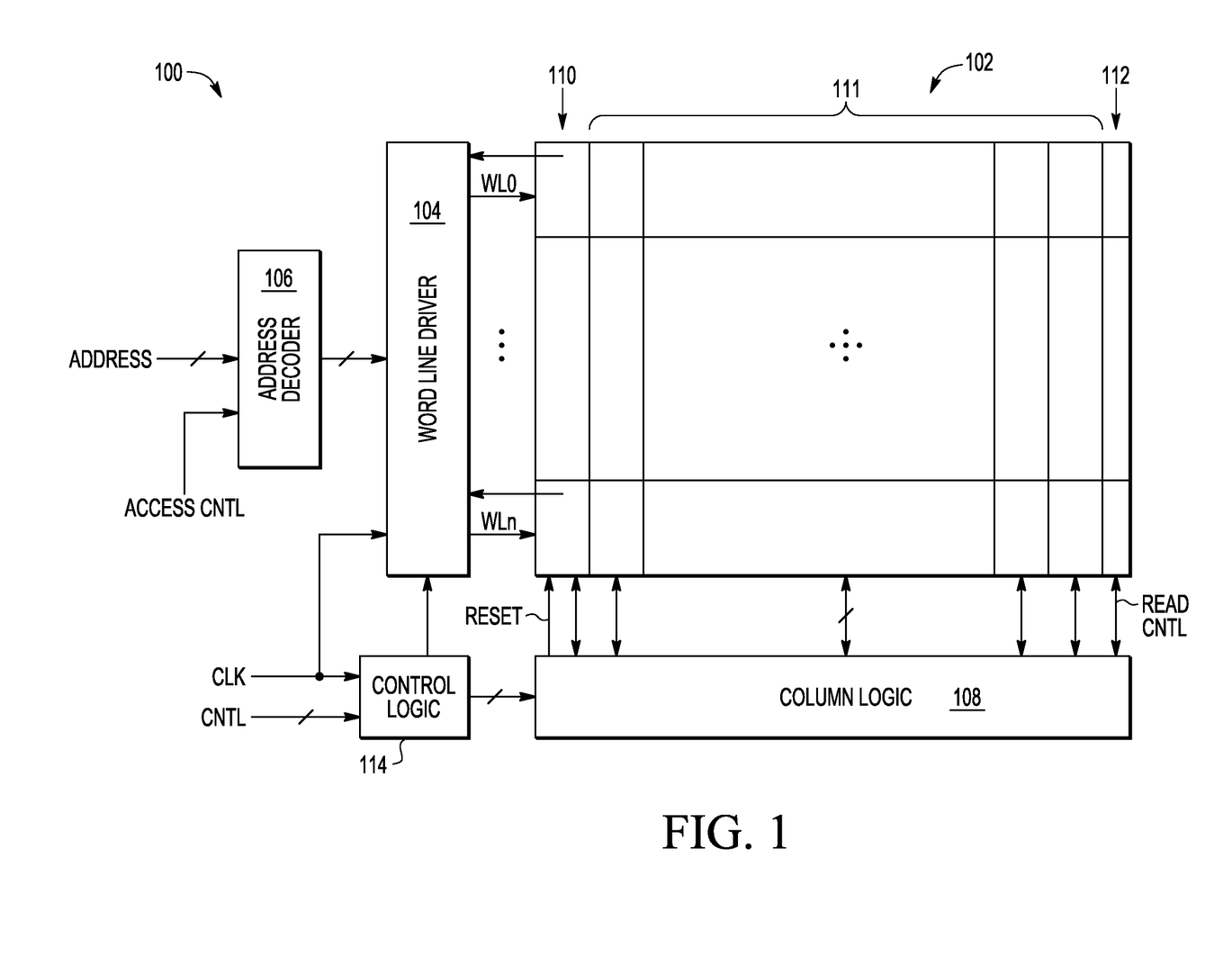
FIG. 1 illustrates, in block diagram form, a memory in accordance with an embodiment of the present disclosure.

FIG. 1 illustrates, in block diagram form, a memory 100 in accordance with one embodiment. Memory 100 includes an address decoder 106, a word line driver 104, a memory array 102, control logic 114, and column logic 108. Memory array 102 includes n+1 word lines (WL0-WLn), in which word line driver 104 is coupled to each of the word lines. Memory array 102 includes a column of control memory cells 110, m columns of bitcells 111, and a column of read control cells 112 (which may also be referred to as a read enable circuit). Therefore, each row of memory array 102 has a control memory cell coupled to the corresponding word line of the row, m bitcells coupled to the corresponding word line of the row, and a read control cell coupled to the corresponding word line of the row. Each memory bit cell of memory bits cells 110 also provides a feedback signal to word line driver 104. Column logic 108 is coupled to memory array 102 and provides data for storage into array 102 and receives data read from array 102. Column logic 108 provides a reset signal to each of control memory cells 110. Note also that column logic 108 includes sense amplifier circuitry, which receives the read control signal from read control cells 112. Control logic 114 receives a clock signal and one or more control signals to control operation of word line driver 104 and column logic 108.

Address decoder 106 receives an access address (ADDRESS) and a corresponding access control (ACCESS CNTL) and performs row decoding to provide one or more port signals to word line driver 104. Word line driver 104, in response to the one or more port signals, selectively drives the word line of the selected row. In one embodiment, each word line of memory array 102 is coupled to two port signals, PortA and PortB (as will be described in more detail below and which may also be referred to as select signals). In this embodiment, an access to the corresponding word line by way of PortA is controlled by the state of the control memory cell of the selected word line. For example, in one embodiment, if the control memory cell of a selected word line (which is selected based on the access address, ADDRESS), stores a logic level 1, access to the selected word line is not blocked and thus allowed. In this case, the selected word line is enabled or driven to perform the memory access. However, if the control memory cell stores a logic level 0, access to the selected word line is blocked in that the selected word line is not enabled (not driven) and that row is not accessed in response to the access address. However, an access to the corresponding word line by way of PortB is not controlled by the state of the control memory cell of the selected word line. In this case, a word line which is accessed by way of PortB overrides the control memory cell.

Figure 6:
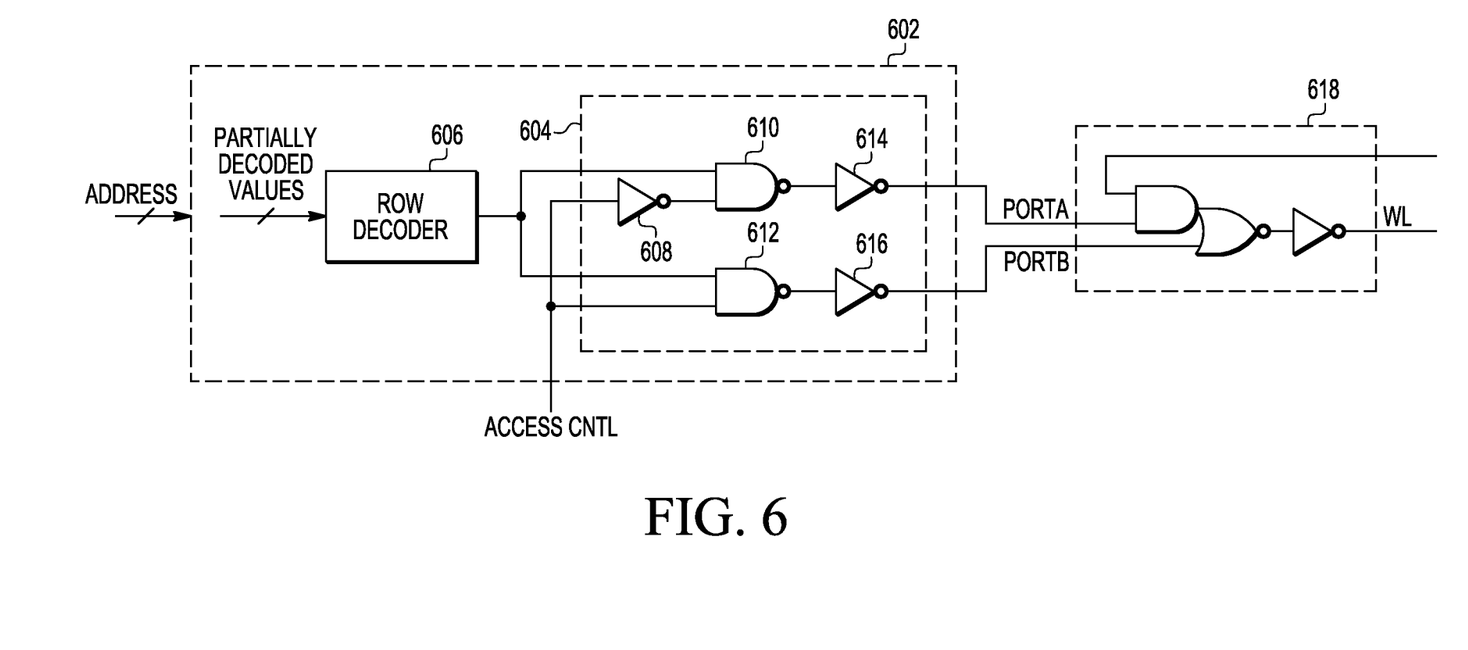
FIG. 6 illustrates, in schematic form, a portion of an address decoder and a portion of a word line driver of FIG. 1, in accordance with an embodiment of the present disclosure.

In one embodiment, PortA may be used for read accesses to memory array 102 and PortB may be used for write accesses to memory array 102. In this manner, read accesses are selectively blocked by the state of the control memory cell of the selected word line. Alternatively, PortA may be used for SER scrubbing and PortB may be used for normal read/write operation. In this manner, SER scrubbing accesses are selectively blocked by the state of the control memory cell of the selected word line. In yet another embodiment, PortA and PortB may be used to differentiate between different access priorities or privileges. For example, PortA may correspond to a lower priority port than PortB. In this manner, lower priority accesses may use PortA such that they can be selectively blocked by the state of the control memory cell of the selected word line, while higher priority accesses may use PortB to perform accesses regardless of the value of the control memory cell. Which port is used for an access to a particular access address can be determined by ACCESS CNTL. Therefore, address decoder 106 may select a particular word line of WL0-WLn while ACCESS CNTL determines whether PortA or PortB will be used to attempt the access of the selected word line. Therefore, ACCESS CNTL may also be referred to as an enable signal or a port enable signal. (FIG. 6 provides an exemplary implementation of a portion of address decoder 106.) Note that if an access via PortA is blocked, then word line driver 104 does not drive the selected word line at all, and the sense amplifiers within column logic 108 are prevented from being enabled by the selected word line by way of the corresponding read control cell 112. In this manner, power consumption can be reduced.

Figure 2:
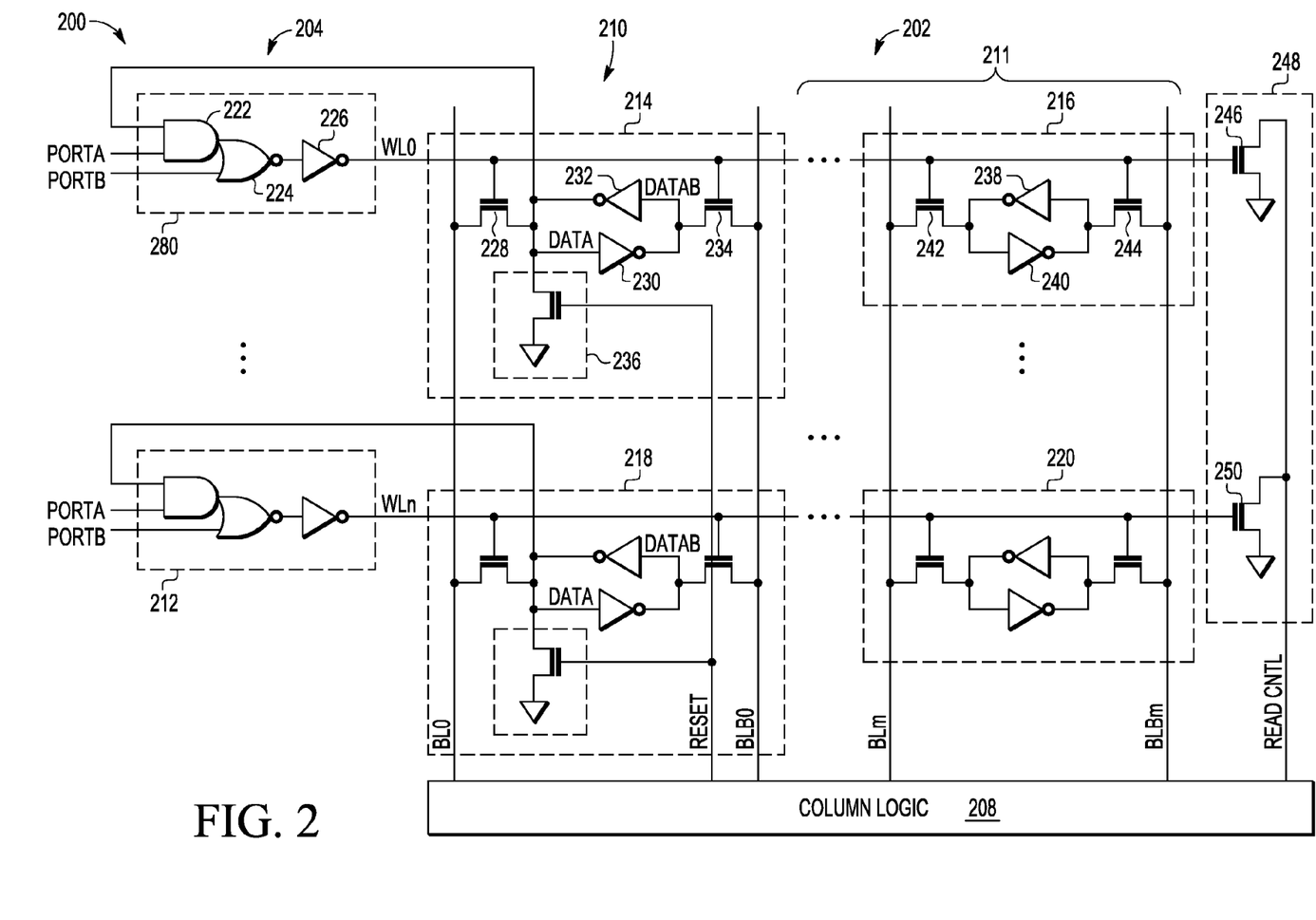
FIG. 2 illustrates, in partial schematic and partial block diagram form, a memory in accordance with an embodiment of the present disclosure.

FIG. 2 illustrates, in partial block diagram and partial schematic form, a memory 200 in accordance with one embodiment. Memory 200 illustrates an exemplary implementation of memory 100. Memory 200 includes a word line driver 204, which may correspond to word line driver 104, a memory array 202, which may correspond to memory array 102, column logic 208, which may correspond to column logic 108. Memory array 202 includes n+1 word lines (WL0-WLn), in which word line driver 204 is coupled to each of the word lines. Memory array 202 includes a column of control memory cells 210 (which may correspond to control memory cells 110), m columns of bitcells 211 (which may correspond to bitcells 111), and a column of read control cells 248 (which may correspond to read control cells 112). Therefore, each row of memory array 202 has a control memory cell coupled to the corresponding word line of the row, m bitcells coupled to the corresponding word line of the row, and a read control cell coupled to the corresponding word line of the row. Each control memory cell of control memory cells 210 provides a feedback signal to word line driver 204 and is coupled to bitline 0 (BL0) and bitline bar 0 (BLB0). Each column of bitcells is coupled to a corresponding bitline pair, such as BL1 and BLB1 to BLm and BLBm, respectively. For example, referring to FIG. 2, row 0 has a control memory cell 214 coupled to WL0, BL0, and BLB0, m bitcells (such as bitcell 216) coupled to WL0 and to a corresponding bitline pair (such as BLm and BLBm for bitcell 216), and a read control cell 246 coupled to WL0. Similarly, row n has a control memory cell 218 coupled to WLn, BL0, and BLB0, m bitcells (such as bitcell 220) coupled to WLn and to a corresponding bitline pair (such as BLm and BLBm for bitcell 220), and a read control cell 250 coupled to WLn.

Bitcell 216 includes N-channel transistors 242 and 244, and inverters 238 and 240. Transistor 242 has a first current electrode connected to BLm, a control electrode connected to WL0, and a second current electrode connected to an output of inverter 238 and an input of inverter 240. Transistor 244 has a first current electrode connected to an output of inverter 240 and an input of inverter 238, a control electrode connected to WL0, and a second current electrode connected to BLBm. The output of inverter 238 is connected to the input of inverter 240, and the output of inverter 240 is connected to the input of inverter 238. Note that each bitcell 211 (including bitcell 220) in array 202 may have the same circuitry and operate analogously as exemplary bitcell 216. The latch within each bitcell formed by the inverters stores the state of the bitcell, and N-channel transistors 242 and 244 are used to read values from bitcell 216 and write values into bitcell 216.

When a selected word line is activated, it is placed at a logic level high, thus turning on the corresponding read control cell (such as transistor 246 for WL0). Also, if any of the read control cells turns on, the sense amplifiers coupled to the bitline pairs are activated to sense the values in the bitcells connected to the activated word line. As will be described below, activation of each word line can further be controlled by access logic coupled to each word line.

For example, as illustrated in FIG. 2, word line driver 204 includes access logic coupled to each of WL0-WLn. For example, access logic 280 is coupled to WL0 and access logic 212 is coupled to WLn. Referring to access logic 280, access logic 280 includes an AND gate 222, a NOR gate 224, and an inverter 226. And gate 222 has a first input connected to a feedback signal from control memory cell 214 and a second input connected to receive a first port signal, PortA. NOR gate 224 has a first input connected to the output of AND gate 222 and a second input connected to receive a second port signal, PortB. Inverter 226 has an input connected to the output of NOR gate 224 and an output connected to WL0. Therefore, by way of access logic 280, either PortA or PortB may be used to attempt an access to WL0 in which an access via PortA will be controlled by the state of control memory cell 214 and an access via PortB will not be affected by the state of control memory cell 214.

Control memory cell 214 includes N-channel transistors 228, 234 and 236, and inverters 232 and 230. Transistor 228 has a first current electrode connected to BL0, a control electrode connected to WL0, and a second current electrode connected to an output of inverter 232, an input of inverter 230, and a first current electrode of transistor 236. Transistor 234 has a first current electrode connected to an input of inverter 232 and an output of inverter 230, a control electrode connected to WL0, and a second current electrode connected to BLB0. The output of inverter 232 is connected to the input of inverter 230, and the output of inverter 230 is connected to the input of inverter 232. A control electrode of transistor 236 is connected to a reset signal (which may be provided by column logic 208), and a second current electrode of transistor 236 is connected to ground. Note that transistor 236 may be referred to as reset circuitry which, in response to assertion of the reset signal to a logic level one, sets the state of control memory cell 214 to a logic level zero by pulling the input to inverter 230 low. Other circuitry may be used in place of or in addition to transistor 236 to perform the resetting. With assertion of the reset signal, all control memory cells 210 of array 202 can be simultaneously reset.

Referring to exemplary control memory cell 214, the latch formed by inverters 232 and 230 store a state (or value) of control memory cell 214. This state may be used to selectively block activation of WL0 when WL0 is selected via PortA. However, if WL0 is selected via PortB, then activation of WL0 is not blocked (i.e. is allowed) regardless of the state of control memory cell 214. Note that when a word line is selected in response to an access address via PortA, the PortA signal corresponding to the selected word line is a logic level one, and when a word line is selected in response to an access address via PortB, the PortB signal corresponding to the selected word line is a logic level one. Only one of the PortA or PortB signals may be at a logic level one when the corresponding word line is selected. In the current example with control memory cell 214, it is assumed that WL0 is selected for access in response to decoding of the access address (ADDRESS), and if WL0 is selected via PortA (based on ACCESS CNTL), PortA is a logic level 1 and if selected via PortB (based on ACCESS CNTL), PortB is a logic level 1.

Still referring to control memory cell 214, if WL0 is selected via PortA, the state of control memory cell 214 determines whether or not activation of the selected word line will be blocked. For example, if the state of control memory cell 214 is a logic level one, activation of WL0 via PortA is allowed (i.e. not blocked), and if the state of control memory cell 214 is a logic level zero, activation of WL0 via Port A is blocked such that WL0 cannot be activated. For example, if the state is a logic level 0, the output of AND gate 222 is forced to be a logic level zero (regardless of the value of PortA). Since the selection is being made via PortA, PortB is a logic level zero as well. Therefore, the output of NOR gate 224 is guaranteed to be 1, and the output of inverter 226 a logic level zero, thus preventing (i.e. blocking) activation of WL0. That is, in order for WL0 to be activated, it needs to be driven to a logic level one, however, a state of zero stored within control memory cell 214 holds WL0 to a logic level zero. If the state of control memory cell 214, however, is a logic level 1, then the output of AND gate 222 will reflect the value or PortA such that if WL0 is selected via PortA (meaning PortA is a logic level one), then the output of AND gate 222 is also a logic level 1. This ensures the output of NOR gate 224 to be a logic level zero and the output of inverter 226 to be a logic level one, thus driving WL0 high and activating WL0. Therefore, if control memory cell 214 stores a logic level 1, and if WL0 is selected via PortA, activation of WL0 is allowed and not blocked.

Still referring to control memory cell 214, if WL0 is selected via PortB, the state of control memory cell 214 cannot block activation of the selected word line. That is, selection of WL0 via PortB overrides control memory cell 214. For example, if WL0 is selected via PortB, then PortB is a logic level one. This guarantees that the output of NOR gate 224 is a logic level zero (regardless of the value of the output of AND gate 222), and the output of inverter 226 is a logic level one. In this manner, if WL0 is selected via PortB, WL0 is activated regardless of the value stored in control memory cell 214. The situations described above for the possible differentiations between PortA and PortB described above therefore apply here. For example, PortB may be used for higher priority or higher privileged accesses than for PortA. As discussed above, PortB can be selected by way of an enable signal, such as ACCESS CNTL. (Note that the same descriptions apply to all access logics in word line driver 204 (including access logic 212) and all of control memory cells 210 (including control memory cell 218)).

FIG. 6 illustrates an exemplary embodiment of a portion of address decoder 106 of FIG. 1 and a portion of word line driver 104. Portion 602 corresponds to a portion of address decoder 106 and portion 618 corresponds to an exemplary type of access logic corresponding to a word line of array 102 (such as access logic 280 of FIG. 2). The incoming access address (ADDRESS) may be partially decoded to produce a plurality of partially decoded values. These partially decoded values are provided to a row decoder 606, which, based on the partially decoded values, selects a particular word line of the plurality of word lines (WL0-WLn). Therefore, when row decoder 606, based on the partially decoded values, selects the particular word line WL illustrated in FIG. 6, the output of row decoder 606 is a logic level one. (Likewise, when row decoder 606, based on the partially decoded values, does not select WL illustrated in FIG. 6, the output of row decoder 606 is a logic level zero.) The access address, ADDRESS, may also be referred to as a row address which is provided to row decoders of address decoder 106, such as row decoder 606, to select a word line of WL0-WLn.

Still referring to FIG. 6, the output of row decoder 606 is provided to logic 604 which includes inverters 608, 614, and 616, and NAND gates 610 and 612. The output of row decoder 606 is provided to a first input of each of NAND gate 610 and 612. ACCESS CNTL is provided to a second input of NAND gate 612 and a first input of inverter 608 whose output is provided to a second input of NAND gate 610. The output of NAND gate 610 is connected to an input of inverter 614 whose output is connected to provide the PortA signal (corresponding to WL) to access logic 618. The output of NAND gate 612 is connected to an input of inverter 616 whose output is connected to provide the PortB signal (corresponding to WL) to access logic 618. Therefore, if the output of row decoder 606 is a logic level zero, indicating that WL is not selected, then the outputs of both inverters 614 and 616 are logic level zeros, thus resulting in neither PortA nor PortB for WL being asserted. However, if the output of row decoder 606 is a logic level one, indicating that WL is selected, then one of PortA or PortB is asserted based on the value of ACCESS CNTL. In the illustrated embodiment, if ACCESS CNTL is asserted (a logic level one), then PortB is asserted (since the output of inverter 616 is a logic level one) and PortA remains a logic level zero. However, if ACCESS CNTL is not asserted (a logic level zero), then PortA is asserted (since the output of inverter 614 is a logic level one) and PortB remains a logic level zero. Note that in alternate embodiments, different logic may be used for logic 604 to allow for ACCESS CNTL to control which port, PortA or PortB, corresponding to a word line is used in activating the selected word line.

Referring back to FIG. 2, access logic 280 provides only one example of logic gates which may be used to allow the state of control memory cell 214 to control activation of WL0 when selected via PortA and to allow activation of WL0 regardless of the state of control memory cell 214 when selected via PortB. That is, other configurations of circuitry may be used, in which, for example, polarities may even be reversed. For example, in alternate embodiments, different configurations of bitcells or control memory cells may be used. In these alternate embodiments, a logic level 1 for control memory cell may result in blocking activation of the word line when selected via PortA while a logic level 0 may result in allowing activation of the word line when selected via PortA.

In one embodiment, all control memory cells 210 can be reset to a logic level zero by way of the reset signal which turns on the reset transistor in each control memory cell (e.g. transistor 236). Accesses to control memory cells 210 can be made by way of PortB (by setting ACCESS CNTL appropriately) such that the state of a control memory cell can be changed to a logic level one to block activation of the corresponding word line when accessed via PortA. Also, note that since PortB allows access to control memory cells 210, individual control memory cells can be changed, via PortB, back to a logic level one to once again allow activation of the selected word line when accessed via PortA. In an alternate embodiment, note that set circuitry rather than reset circuitry may be used to simultaneously set the values of control memory cells 210.

In an alternate embodiment, reset circuitry (or set circuitry) is not present in control memory cells 210 since the values of the control memory cells 210 may be readily changed by accessing the control memory cells via PortB. That is, the presence of PortB allows for the state of each control memory cell to be independently and individually changed. However, as will be described below in reference to FIG. 3, alternate embodiments may not distinguish between different types of access ports such that only a single port, PortA, is present in which activation of the word line is always controlled by the state of the corresponding control memory cell. In this embodiment, set or reset circuitry is used to change the value of the control memory cell.

Figure 3:
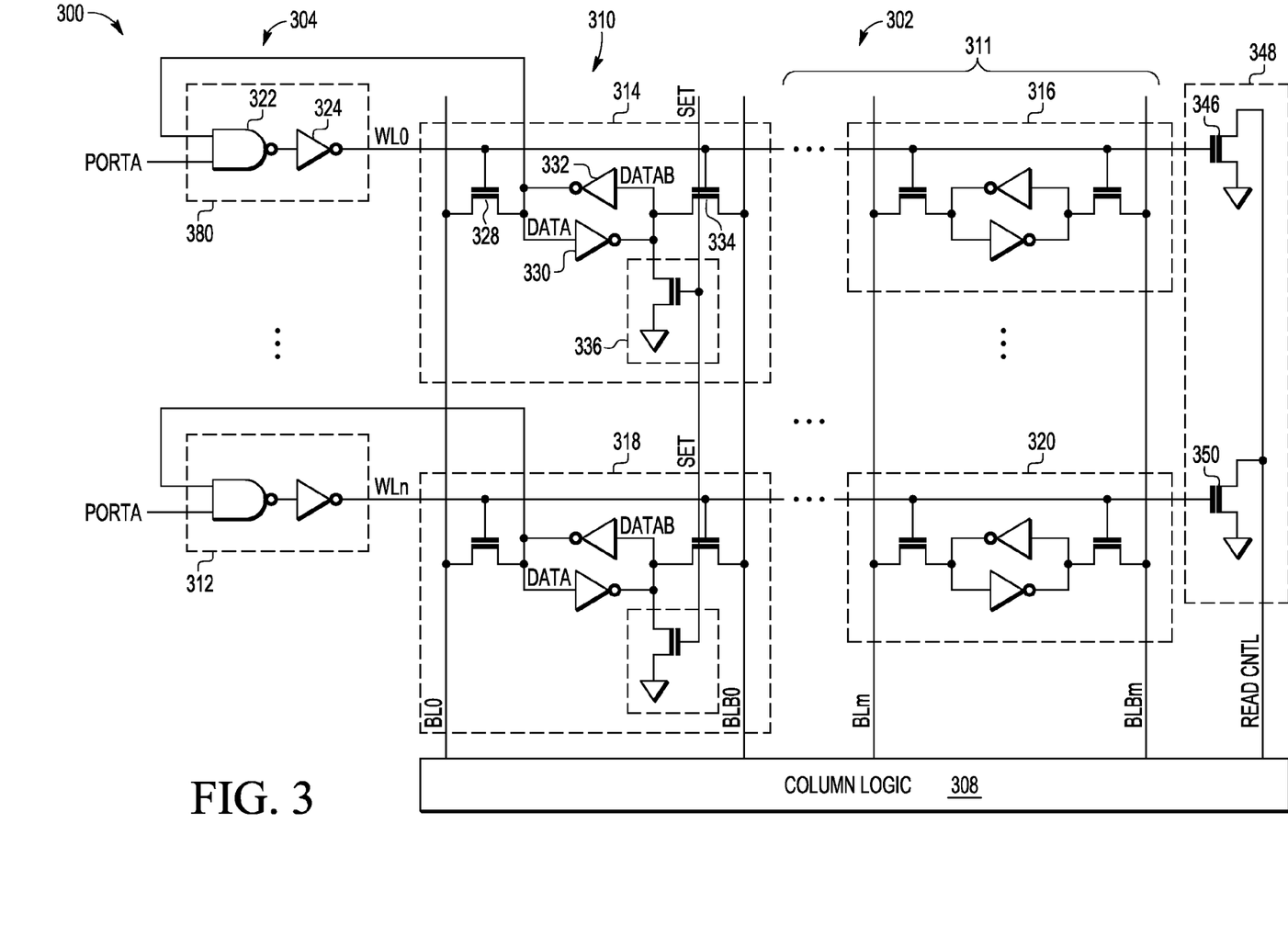
FIG. 3 illustrates, in partial schematic and partial block diagram form, a memory in accordance with an embodiment of the present disclosure.

FIG. 3 illustrates, in partial block diagram and partial schematic form, a memory 300 in accordance with one embodiment. Memory 300 illustrates another exemplary implementation of memory 100. Memory 300 includes a word line driver 304, which may correspond to word line driver 104, a memory array 302, which may correspond to memory array 102, column logic 308, which may correspond to column logic control 108. Memory array 302 includes n+1 word lines (WL0-WLn), in which word line driver 304 is coupled to each of the word lines. Memory array 302 includes a column of control memory cells 310 (which may correspond to control memory cells 110), m columns of bitcells 311 (which may correspond to bitcells 111), and a column of read control cells 348 (which may correspond to read control cells 112). Therefore, each row of memory array 302 has a control memory cell coupled to the corresponding word line of the row, m bitcells coupled to the corresponding word line of the row, and a read control cell coupled to the corresponding word line of the row. Each control memory cell of control memory cells 310 provides a feedback signal to word line driver 304 and is coupled to bitline 0 (BL0) and bitline bar 0 (BLB0). Each column of bitcells 311 is coupled to a corresponding bitline pair, such as BL1 and BLB1 to BLm and BLBm, respectively. For example, referring to FIG. 3, row 0 has a control memory cell 314 coupled to WL0, BL0, and BLB0, m bitcells (such as bitcell 316) coupled to WL0 and to a corresponding bitline pair (such as BLm and BLBm for bitcell 316), and a read control cell 346 coupled to WL0. Similarly, row n has a control memory cell 318 coupled to WLn, BL0, and BLB0, m bitcells (such as bitcell 320) coupled to WLn and to a corresponding bitline pair (such as BLm and BLBm for bitcell 320), and a read control cell 350 coupled to WLn.

Bitcell 316 has a configuration like that of bitcell 216 of FIG. 2; therefore, the descriptions provided for bitcell 216 also apply to bitcell 316. Similarly, the descriptions provided above for column logic 208 and read control cells 248 also apply to column logic 308 and read control cells 348.

As illustrated in FIG. 3, word line driver 304 includes access logic coupled to each of WL0-WLn. For example, access logic 380 is coupled to WL0 and access logic 312 is coupled to WLn. Referring to access logic 380, access logic 380 includes a NAND gate 322 and an inverter 324. NAND gate 322 has a first input connected to a feedback signal from control memory cell 314 and a second input connected to receive a port signal, PortA. Inverter 324 has an input connected to the output of NAND gate 322 and an output connected to WL0. Therefore, unlike the implementation of FIG. 2, only a single port, PortA, may be used to attempt an access to WL0 in which an access via PortA will be controlled by the state of control memory cell 314. Note that for this embodiment, ACCESS CNTL of FIG. 1 need not be present in memory 100.

Control memory cell 314 is similar in configuration to control memory cell 214; however, control memory cell 314 includes set circuitry (rather than reset circuitry) which, in response to a set signal (which may be provided by column logic 308 rather than a reset signal) forces the state of control memory cell 314 to a logic level one. Control memory cell 314 includes N-channel transistors 328, 334 and 336, and inverters 332 and 330. Transistor 328 has a first current electrode connected to BL0, a control electrode connected to WL0, and a second current electrode connected to an output of inverter 332 and an input of inverter 330. Transistor 334 has a first current electrode connected to an input of inverter 332, an output of inverter 330, and a first current electrode of transistor 336. Transistor 334 has a control electrode connected to WL0 and a second current electrode connected to BLB0. The output of inverter 332 is connected to the input of inverter 330, and the output of inverter 330 is connected to the input of inverter 332. A control electrode of transistor 336 is connected to a set signal (which may be provided by column logic 308), and a second current electrode of transistor 336 is connected to ground. Note that transistor 336 may be referred to as set circuitry which, in response to assertion of the set signal to a logic level one, sets the state of control memory cell to a logic level one by pulling the input to inverter 332 low. Other circuitry may be used in place of or in addition to transistor 336 to perform the setting. With assertion of the set signal, all control memory cells 310 of array 302 can be simultaneously set.

Referring to exemplary control memory cell 314, the latch formed by inverters 332 and 330 store a state (or value) of control memory cell 314. This state may be used to selectively block activation of WL0 via PortA. Note that when a word line is selected in response to an access address, the PortA signal corresponding to the selected word line is a logic level one. In the current example with control memory cell 314, it is assumed that WL0 is selected for access in response to decoding of the access address (ADDRESS), therefore PortA is a logic level 1. If the state of control memory cell 314 is a logic level one, then activation of WL0 is allowed (i.e. not blocked); however, if the state of control memory cell 314 is a logic level zero, then activation of WL0 is blocked. For example, when the state of control memory cell 314 is a logic level one, then the output of NAND gate 322 reflects the value of PortA. Therefore if WL0 is selected, PortA is a logic level one, then the output of NAND gate 322 is a logic level zero and the output of inverter 324 is a logic level one, which drives WL0 high, thus resulting in activation of WL0. However, when the state of control memory cell 314 is a logic level 0, then the output of NAND gate 322 is guaranteed to be a logic level one and the output of inverter 324 is guaranteed to be a logic level zero, thus blocking activation of WL0.

Access logic 380 provides only one example of logic gates which may be used to allow the state of control memory cell 314 to control activation of WL0. That is, other configurations of circuitry may be used, in which, for example, polarities may even be reversed. For example, in alternate embodiments, different configurations of bitcells or control memory cells may be used. In these alternate embodiments, a logic level 1 for control memory cell may result in blocking activation of the word line while a logic level 0 may result in allowing activation of the word line.

In the example of FIG. 3, a global set which simultaneously sets the state of all control memory cells 310 to a logic level one may be used to allow access to the corresponding word line. While the state is a logic level one and access is allowed, an access may be made to an individual control memory cell to change its value to a logic level zero. At this point, activation of the corresponding word line is blocked. Therefore, in this example, each control memory cell is programmable only once to block activation and cannot be changed again until a global set is again performed to allow access.

With the embodiment of either FIG. 2 or 3, note that both set and reset circuitry may be present for each control memory cell such that they can all be set or reset accordingly.

Figure 4:
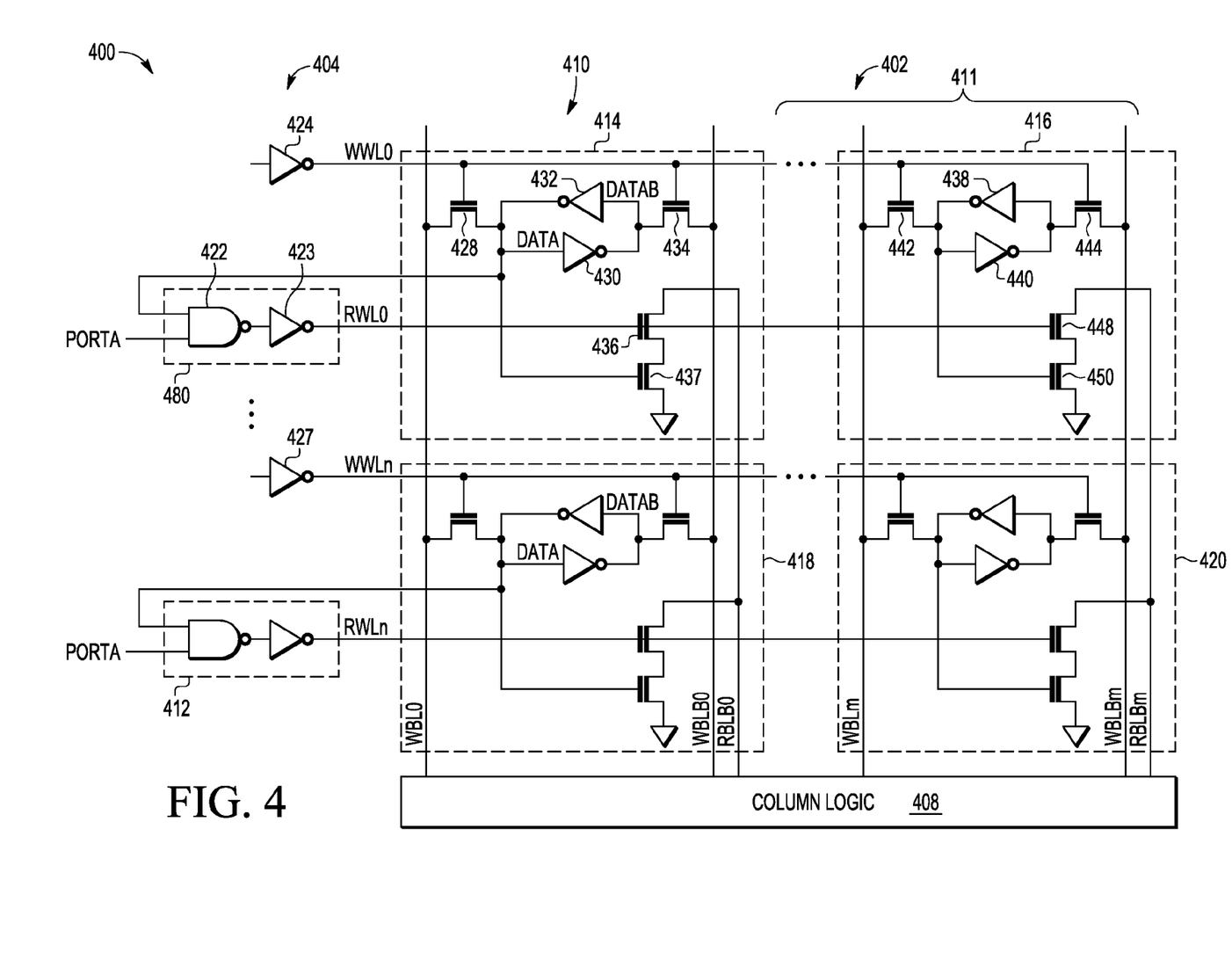
FIG. 4 illustrates, in partial schematic and partial diagram form, a memory in accordance with an embodiment of the present disclosure.

FIG. 4 illustrates, in partial block diagram and partial schematic form, a memory 400 in accordance with one embodiment. Memory 400 illustrates another exemplary implementation of memory 100. In one embodiment, memory 400 corresponds to a register file implementation. Memory 400 includes a word line driver 404, which may correspond to word line driver 104, a memory array 402, which may correspond to memory array 102, column logic 408, which may correspond to column logic 108. Memory array 402 includes n+1 write word lines (WWL0-WWLn) and n+1 read word lines (RWL0-RWLn), in which word line driver 404 is coupled to each of the write and read word lines. Memory array 402 includes a column of control memory cells 410 (which may correspond to control memory cells 110), m columns of bitcells 411 (which may correspond to bitcells 111). Note that no read control cells are included in the illustrated embodiment. Therefore, each row of memory array 402 has a control memory cell coupled to the corresponding word line of the row and m bitcells coupled to the corresponding word line of the row. Each control memory cell of control memory cells 410 provides a feedback signal to the read word line portion of word line driver 404 and is coupled to write bitline 0 (WBL0), write bitline bar 0 (WBLB0), and read bitline bar 0 (RBLB 0). Each column of bitcells 411 is coupled to corresponding bitlines, such as WBL1, WBLB1, and RBLB1 to WBLm, WBLBm, and RBLBm, respectively. For example, referring to FIG. 4, row 0 has a control memory cell 414 coupled to WWL0, RWL0, WBL0,WBLB0, and RBLB0, and m bitcells (such as bitcell 416) coupled to WWL0, RWL0, and to corresponding bitlines (such as WBLm, WBLBm, and RBLBm for bitcell 416). Similarly, row n has a control memory cell 418 coupled to WWLn, RWLn, WBL0, WBLB0, and RBLB0, and m bitcells (such as bitcell 420) coupled to WWLn and RWLn and to a corresponding bitlines (such as WBLm, WBLBm, and RBLBm for bitcell 420).

Bitcell 416 includes inverters 438 and 440 and n-channel transistors 442, 444, 448 and 450. Transistor 442 has a first current electrode connected to WBLm, a control electrode connected to WWL0, and a second current electrode connected to an output of inverter 438 and an input of inverter 440. Transistor 444 has a first current electrode connected to an output of inverter 440 and an input of inverter 438, a control electrode connected to WWL0, and a second current electrode connected to WBLBm. The output of inverter 438 is connected to the input of inverter 440, and the output of inverter 440 is connected to the input of inverter 438. Transistor 448 has a first current electrode connected to RBLBm, a control electrode connected to RWL0, and a second current electrode connected to a first current electrode of transistor 450. Transistor 450 has a control electrode connected to the output of inverter 438 and a second current electrode connected to ground. Note that each bitcell 411 (including bitcell 420) in array 402 may have the same circuitry and operate analogously as exemplary bitcell 416. The latch within each bitcell formed by the inverters stores the state of the bitcell. For writing into bitcell 416, WWL0 is activated and transistors 442 and 444 are turned on while RWL0 is not activated and thus maintaining transistor 448 off. WBLm and WBLBm can then be used to write a state into the latch. For reading from bitcell 416, RWL0 is activated and transistor 448 is turned on. In this manner, the value stored in the latch (and provided to the control electrode of transistor 450, will be used to provide the state of bitcell 416 by way of RBLBm. Column logic 408 includes the circuitry to both write the value appropriately into bitcell 416 by way of WBLm and WBLBm and to read the value appropriately by way of RBLBm.

As illustrated in FIG. 4, word line driver 404 includes inverters, such as inverters 424 and 427, connected to each of WWL0-WWLn to drive the write word lines. Word line driver 404 also includes access logic coupled to each of RWL0-RWLn. For example, access logic 480 is coupled to RWL0 and access logic 412 is coupled to RWLn. Referring to access logic 480, access logic 480 includes a NAND gate 422 and an inverter 423. NAND gate 422 has a first input connected to a feedback signal from control memory cell 414 and a second input connected to receive a port signal, PortA. Inverter 423 has an input connected to the output of NAND gate 422 and an output connected to RWL0. Therefore, a read access via PortA will be controlled by the state of control memory cell 414. However, a write access will not be controlled by the state of control memory cell 414.

Control memory cell 414 includes N-channel transistors 428, 434, 436 and 437, and inverters 432 and 430. Transistor 428 has a first current electrode connected to WBL0, a control electrode connected to WWL0, and a second current electrode connected to an output of inverter 432 and an input of inverter 430. Transistor 434 has a first current electrode connected to an input of inverter 432, and an output of inverter 430. Transistor 434 has a control electrode connected to WWL0 and a second current electrode connected to WBLB0. The output of inverter 432 is connected to the input of inverter 430, and the output of inverter 430 is connected to the input of inverter 432. A control electrode of transistor 436 is connected to RWL0, a first current electrode of transistor 436 is connected to RBLB0, and a second current electrode of transistor 436 is connected to a first current electrode of transistor 437. A control electrode of transistor 437 is connected to the output of inverter 432, and a second current electrode of transistor 437 is connected to ground.

Referring to exemplary control memory cell 414, the latch formed by inverters 432 and 430 store a state (or value) of control memory cell 414. This state may be used to selectively block activation of RWL0 via PortA. Note that when a word line is selected in response to a read access address, the PortA signal corresponding to the selected word line is a logic level one. For example, if RWL0 is selected for activation and the data stored in control memory cell 414 is a logic level 1, then RWL0 will be activated and asserted to a logic level 1, turning on transistors 436 and 448 as well. In this case, the value stored in a corresponding memory cell will determine whether transistors 437 or 450 are turned on or off, thus allowing column logic 408 to determine the value stored in the memory cell. If RWL0 is selected for activation and the data stored in control memory cell is a logic level 0, then RWL0 will be maintained at a logic level 0 because regardless of the value of PortA, the output of NAND gate 422 will be a logic level 1. In this manner, activation of RWL0 is blocked. However, a write access to bitcells 411, made by activating a write word line (WWL0-WWLn) will not be affected by the value in control memory cell 414. (Note that for this embodiment, ACCESS CNTL of FIG. 1 also need not be present in memory 100.) Therefore, in this example, word line activations are not blocked for write accesses, but may be blocked for read accesses.

Access logic 480 provides only one example of logic gates which may be used to allow the state of control memory cell 414 to control activation of RWL0. That is, other configurations of circuitry may be used, in which, for example, polarities may even be reversed. For example, in alternate embodiments, different configurations of bitcells or control memory cells may be used. In these alternate embodiments, a logic level 1 for control memory cell may result in blocking activation of the word line while a logic level 0 may result in allowing activation of the word line.

Figure 5:
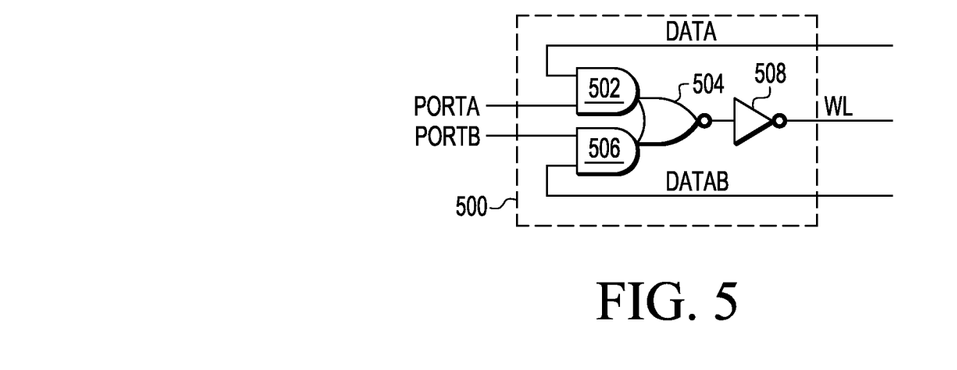
FIG. 5 illustrates, in schematic form, a word line driver in accordance with an embodiment of the present disclosure.

FIG. 5 illustrates, in schematic form, access logic 500 which may be used in place of some of the access logics described above, such as in place of access logic 280 of FIG. 2. As in the example of FIG. 2, an access to a selected word line, WL, can be made via either PortA or PortB. Therefore, ACCESS CNLT of FIG. 1 may be used to determine which port is used. Access logic 500 includes AND gates 502 and 506, NOR gate 504, and inverter 508. A first input of AND gate 502 is connected to a first node of a control memory cell, representative of the data value stored in the cell (e.g. to the output of inverter 232 of control memory cell 214), a second input of AND gate 502 is connected to receive PortA, and an output of AND gate 502 is connected to a first input of NOR gate 504. A first input of AND gate 506 is connected to receive PortB, a second input of AND gate 506 is connected to a different node of the control memory cell, representative of the inverted data stored in the cell (e.g. to the output of inverter 230 of control memory cell 214), and an output of AND gate 506 is connected to a second input of NOR gate 504. An output of NOR gate 504 is connected to an input of inverter 508, whose output is connected to the corresponding word line, WL.

In the example of FIG. 5 (which will be described within the context of FIG. 2, in which it is assumed that access logic 280 is replaced with access logic 500), when the state of control memory cell 214 is a logic level one, then accesses via PortA to WL are allowed and not blocked, while any accesses via PortB to WL are blocked. That is, if the state of control memory cell 214 is a logic level one, then the output of AND gate 506 is guaranteed to be a logic level 0, thus blocking accesses via PortB. However, when the state of control memory cell 214 is a logic level 0, then access via PortB to WL are allowed and not blocked, while any accesses via PortA to WL are blocked. That is, if the state of control memory cell 214 is a logic level 0, then the output of AND gate 502 is guaranteed to be a logic level 0, thus blocking accesses via PortA.

Access logic 500 provides only one example of logic gates which may be used to selectively block activation of WL using a control memory cell. Alternatively, other configurations of circuitry may be used.

By now it should be appreciated that there has been provided a memory in which a control memory cell connected to each word line can be used to selectively block activation of a word line in order to reduce power consumption. For example, activation of a word line can be blocked by placing the corresponding control memory cell into the appropriate state in order to prevent unnecessary accesses to the world line. In some embodiments, an additional access port may be included, which, when selected, allows the control memory cell to be overridden such that activation of the corresponding word line cannot be blocked, regardless of the state of the control memory cell.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different architectures. For example, although FIG. 1 and the discussion thereof describe an exemplary memory, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Although the invention is described herein with reference to specific embodiments, various modifications and changes can be made without departing from the scope of the present invention as set forth in the claims below. For example, each bitcell or control memory cell can have different configurations based on the desired use of the memory and type of memory. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a memory system including a memory array having a plurality of word lines, a plurality of bit cells coupled to the word lines, and a plurality of control memory cells coupled to the word lines, wherein each word line of the plurality of word lines has a control memory cell coupled thereto and each control memory cell has an output; and a plurality of logic circuits coupled to the plurality of word lines, wherein the output of each control memory cell is coupled to a corresponding one of the plurality of logic circuits, wherein the plurality of logic circuits prevents access to the word line selected by a row address if the output of the control memory cell coupled to the selected word line is in a first logic state. Item 2 includes the memory system of item 1, and further includes a row decoder coupled to the plurality of logic circuits and for receiving the row address, wherein each logic circuit corresponds to a different one of the control memory cells and is coupled to the output of the control memory cell to which it corresponds. Item 3 includes the memory system of item 1, and further includes a reset line connected to the control memory cells to reset the outputs of the control memory cells to a second logic state. Item 4 includes the memory system of item 3, wherein the plurality of logic circuits can allow enabling the selected word line when the output of the control memory cell of the selected word line is in the first logic state if the logic circuit of the selected word line receives an enable signal. Item 5 includes the memory system of item 1, wherein the plurality of logic circuits can allow enabling the selected word line when the output of the control memory cell of the selected word line is in the first logic state if the logic circuit of the selected word line receives an enable signal. Item 6 includes the memory system of item 1, wherein the memory array further includes bit lines coupled to the plurality of bit cells and the plurality of control memory cells and column logic coupled to the plurality of bit lines. Item 7 includes the memory system of item 6, and further includes a read enable circuit coupled to the plurality of word lines and the column logic to enable sensing by the column logic if one of the word lines is enabled. Item 8 includes the memory system of item 7, wherein the read enable circuit includes a plurality of transistors having gates coupled to the word lines, first current electrodes coupled to a power supply terminal, and second current electrodes coupled together and to the column logic. Item 9 includes the memory system of item 1, and further includes allow means for allowing a selected word line to be enabled even if the output of the control memory cell of the selected word line is at the first logic state. Item 10 includes the memory system of item 9, wherein the allow means changes the output of the control memory cell of the selected word line to a second logic state. Item 11 includes the memory system of item 9, wherein the allow means allows enabling the selected word line if an enable signal is provided to the logic circuit corresponding to the selected word line.

Item 12 includes a memory including an array of bit cells in rows attached to word lines; a plurality of control memory cells coupled to the word lines and having outputs, wherein each word line includes a corresponding one of the plurality of control memory cells including a first word line having a first subset of the bit cells and a first control memory cell having a first output; a plurality of logic circuits, coupled to the word lines and to the plurality of control memory cells, the plurality of logic circuits including a first logic circuit coupled to the first word line and the output of the first control memory cell; a row decoder for selecting a word line based on a row address; wherein if the row address selects the first word line and the memory is in a first mode: the row decoder asserts a select signal to the first logic circuit; and the first logic circuit is blocked from enabling the first word line if the output of the first control memory cell is in a first logic state. Item 13 includes the memory of item 12, wherein, the first logic circuit enables the first word line if the output of the first control memory cell is in a second logic state. Item 14 includes the memory of item 13, wherein if the row address selects the first word line and the memory is in a second mode: the row decoder asserts a select signal to the first logic circuit; and the first logic circuit enables the first word line even if the output of the first control memory cell is in the first logic state. Item 15 includes the memory of item 14, and further includes a reset circuit that causes the first control memory cell to provide the second logic state as its output in response to a reset signal. Item 16 includes the memory of item 12, and further includes a reset circuit that causes the first control memory cell to provide a second logic state as its output in response to a reset signal. Item 17 includes the memory of item 12, and further includes a read enable circuit coupled to the first word line to enable sensing of one or more bit cells coupled to the first word line if the first word line is enabled.

Item 18 includes a method of operating a memory having a memory array having a plurality of word lines with bit cells and control memory cells coupled to the word lines, the method including selecting a first word line of the plurality of word lines based on a row address provided to a row decoder, wherein a first control memory cell of the plurality of control memory cells is coupled to the first word line; sensing a logic state of the first control memory cell; if the first control memory cell is in a first logic state, blocking the enabling of the first word line; and if the first control memory cell is in a second logic state, allowing enabling of the first word line. Item 19 includes the method of item 18, and further includes allowing the enabling of the first word line, even if the first control memory cell is in the first logic state, if an enable signal is provided. Item 20 includes the method of item 18, and further includes causing the first control memory cell to be in the second logic state.

What is claimed is:

1. A memory system, comprising:
    a memory array having a plurality of word lines, a plurality of bit cells coupled to the word lines, and a plurality of control memory cells coupled to the word lines, wherein each word line of the plurality of word lines has a control memory cell coupled thereto and each control memory cell has an output; and
    a plurality of logic circuits coupled to the plurality of word lines, wherein the output of each control memory cell is coupled to a corresponding one of the plurality of logic circuits, wherein when a row address is selected for a memory access, the plurality of logic circuits prevents access to the word line selected by a row address for all of the memory access if the output of the control memory cell coupled to the selected word line is in a first logic state.

2. The memory system of claim 1, further comprises a row decoder coupled to the plurality of logic circuits and for receiving the row address, wherein each logic circuit corresponds to a different one of the control memory cells and is coupled to the output of the control memory cell to which it corresponds.

3. The memory system of claim 1, further comprising a reset line connected to the control memory cells to reset the outputs of the control memory cells to a second logic state.

4. The memory system of claim 3, wherein the plurality of logic circuits can allow enabling the selected word line when the output of the control memory cell of the selected word line is in the first logic state if the logic circuit of the selected word line receives an enable signal.

5. The memory system of claim 1, wherein the plurality of logic circuits can allow enabling the selected word line when the output of the control memory cell of the selected word line is in the first logic state if the logic circuit of the selected word line receives an enable signal.

6. The memory system of claim 1, wherein the memory array further comprises bit lines coupled to the plurality of bit cells and the plurality of control memory cells and column logic coupled to the plurality of bit lines.

7. The memory of claim 6, further comprising a read enable circuit coupled to the plurality of word lines and the column logic to enable sensing by the column logic if one of the word lines is enabled.

8. The memory of claim 7, wherein the read enable circuit comprises a plurality of transistors having gates coupled to the word lines, first current electrodes coupled to a power supply terminal, and second current electrodes coupled together and to the column logic.

9. The memory of claim 1, further comprising allow means for allowing a selected word line to be enabled even if the output of the control memory cell of the selected word line is at the first logic state.

10. The memory of claim 9, wherein the allow means changes the output of the control memory cell of the selected word line to a second logic state.

11. The memory of claim 9, wherein the allow means allows enabling the selected word line if an enable signal is provided to the logic circuit corresponding to the selected word line.

12. A memory, comprising:
an array of bit cells in rows attached to word lines;
a plurality of control memory cells coupled to the word lines and having outputs, wherein each word line includes a corresponding one of the plurality of control memory cells including a first word line having a first subset of the bit cells and a first control memory cell having a first output;
a plurality of logic circuits, coupled to the word lines and to the plurality of control memory cells, the plurality of logic circuits including a first logic circuit coupled to the first word line and the output of the first control memory cell;
a row decoder for selecting a word line based on a row address;
wherein if the row address selects the first word line for a memory access and the memory is in a first mode:
the row decoder asserts a select signal to the first logic circuit; and
the first logic circuit is blocked from enabling the first word line for all of the memory access if the output of the first control memory cell is in a first logic state.

13. The memory of claim 12, wherein, the first logic circuit enables the first word line if the output of the first control memory cell is in a second logic state.

14. The memory of claim 13, wherein if the row address selects the first word line and the memory is in a second mode:
the row decoder asserts a select signal to the first logic circuit; and
the first logic circuit enables the first word line even if the output of the first control memory cell is in the first logic state.

15. The memory of claim 14, further comprising a reset circuit that causes the first control memory cell to provide the second logic state as its output in response to a reset signal.

16. The memory of claim 12, further comprising a reset circuit that causes the first control memory cell to provide a second logic state as its output in response to a reset signal.

17. The memory of claim 12, further comprising a read enable circuit coupled to the first word line to enable sensing of one or more bit cells coupled to the first word line if the first word line is enabled.

18. A method of operating a memory having a memory array having a plurality of word lines with bit cells and control memory cells coupled to the word lines, the method comprising:
selecting a first word line of the plurality of word lines based on a row address provided to a row decoder for a memory access, wherein a first control memory cell of the plurality of control memory cells is coupled to the first word line;
sensing a logic state of the first control memory cell;
if the first control memory cell is in a first logic state, blocking the enabling of the first word line for all of the memory access; and
if the first control memory cell is in a second logic state, allowing enabling of the first word line for the memory access.

19. The of method of claim 18, further comprising allowing the enabling of the first word line, even if the first control memory cell is in the first logic state, if an enable signal is provided.

20. The method of claim 18, further comprising causing the first control memory cell to be in the second logic state.

* * * * *